United States Patent [19]

Weber

[11] Patent Number: 4,491,972
[45] Date of Patent: Jan. 1, 1985

[54] RADIO TRANSMITTER MODULATION CONTROL CIRCUITRY

[75] Inventor: Paul J. Weber, Elgin, Ill.

[73] Assignee: Motorola, Inc., Schaumburg, Ill.

[21] Appl. No.: 613,742

[22] Filed: May 22, 1984

Related U.S. Application Data

[63] Continuation of Ser. No. 473,523, Mar. 10, 1983, abandoned, which is a continuation of Ser. No. 267,096, May 26, 1981, abandoned.

[51] Int. Cl.³ ............................ H04B 1/04; H03F 1/34
[52] U.S. Cl. .................................... 455/110; 455/108; 455/116; 330/294; 330/303
[58] Field of Search ............... 330/107, 109, 254, 260, 330/294, 302, 303, 304; 455/91, 110, 108, 116; 381/120, 121; 332/38

[56] References Cited

U.S. PATENT DOCUMENTS

| | | |
|---|---|---|
| 2,025,595 | 12/1935 | Kozanowski et al. |
| 2,491,590 | 12/1949 | Sorensen . |
| 3,320,536 | 5/1967 | Lockwood . |
| 3,626,331 | 12/1971 | Burns . |
| 3,643,173 | 2/1972 | Whitten ............................ 330/260 |
| 3,673,512 | 6/1972 | Walters . |
| 4,038,603 | 7/1977 | Bethards . |
| 4,103,243 | 7/1978 | Orban . |
| 4,117,412 | 9/1978 | Holman ............................ 330/294 |
| 4,122,417 | 10/1978 | Takasaki et al. .................. 330/304 |
| 4,187,479 | 2/1980 | Ishizuka et al. ................... 330/304 |
| 4,189,681 | 2/1980 | Lawson et al. .................... 330/294 |
| 4,205,276 | 5/1980 | Wright et al. . |
| 4,208,548 | 6/1980 | Orban . |
| 4,225,822 | 9/1980 | Kariatsumari .................... 455/108 |
| 4,228,368 | 10/1980 | Orban . |
| 4,241,266 | 12/1980 | Orban . |
| 4,249,042 | 2/1981 | Orban . |
| 4,291,276 | 11/1979 | Ida ................................... 330/304 |

*Primary Examiner*—Jin F. Ng
*Attorney, Agent, or Firm*—Rolland R. Hackbart; Edward M. Roney; James W. Gillman

[57] ABSTRACT

Improved radio transmitter modulation control circuitry is described which significantly increases the average power of the modulating signal, resulting in enhanced audio signal quality since the signal-to-noise ratio is likewise increased. The inventive modulation control circuitry includes a microphone 110, audio amplifier 120, splatter filter 130, modulator 150, potentiometer 140, oscillator and transmitter 180, and antenna 190. The audio amplifier 120 further includes an operational amplifier 160 having an input resistor 162 coupled via capacitor 168 to microphone 110, a phase-lag filter 170 coupled to the output of the operational amplifier 160, and a feedback resistor 161 coupled between the filter 170 and the input resistor 162. When driven into amplitude limiting, the phase and amplitude of harmonic signals from the operational amplifier 160 are altered by phase-lag filter 170 to produce a waveform similar to that shown in FIG. 2. When operated linearly, the audio amplifier 120 has a flat frequency response, the filter 170 having no effect since it is in the feedback loop. The improved modulation control circuitry of the present invention can be advantageously utilized in both amplitude and frequency modulated radios 100 for enhancing the audio signal quality thereof.

17 Claims, 4 Drawing Figures

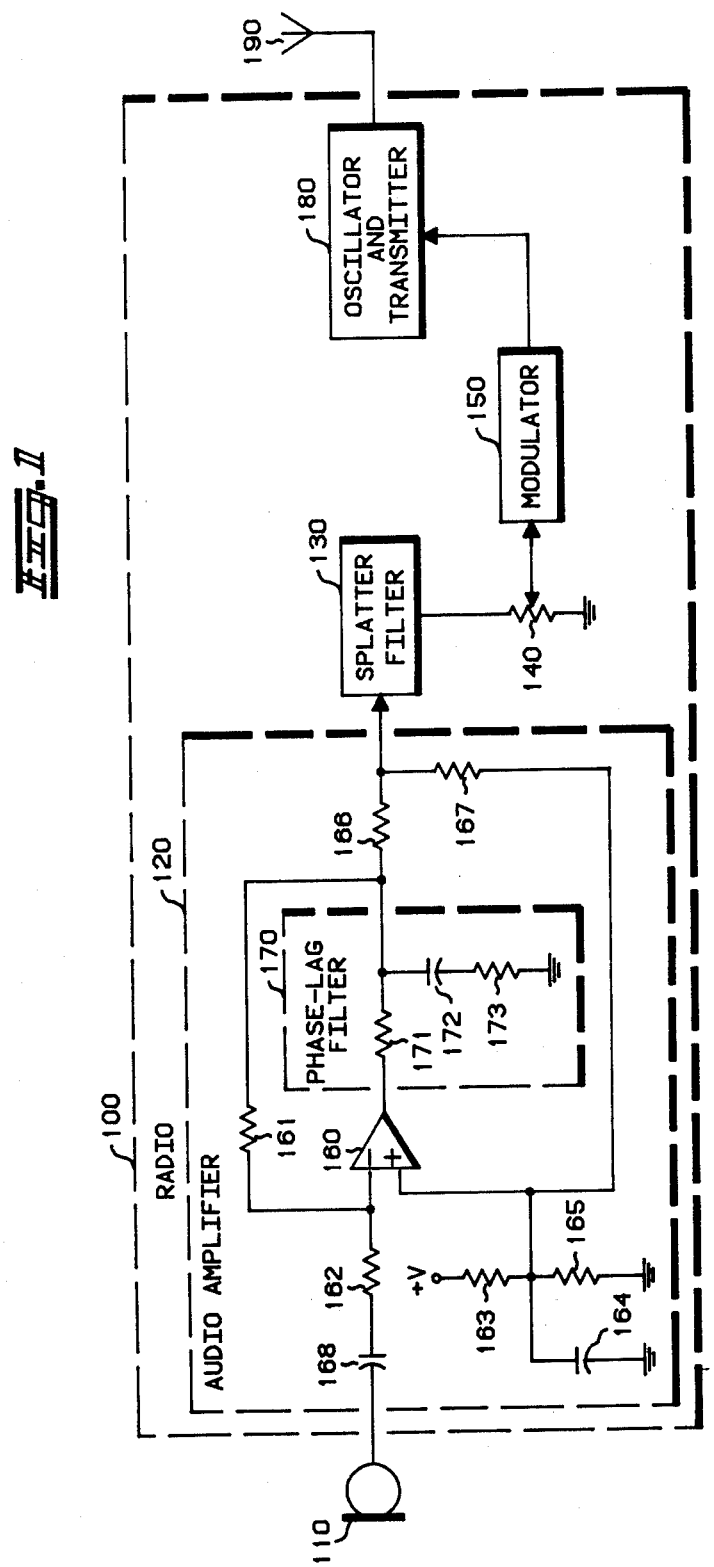

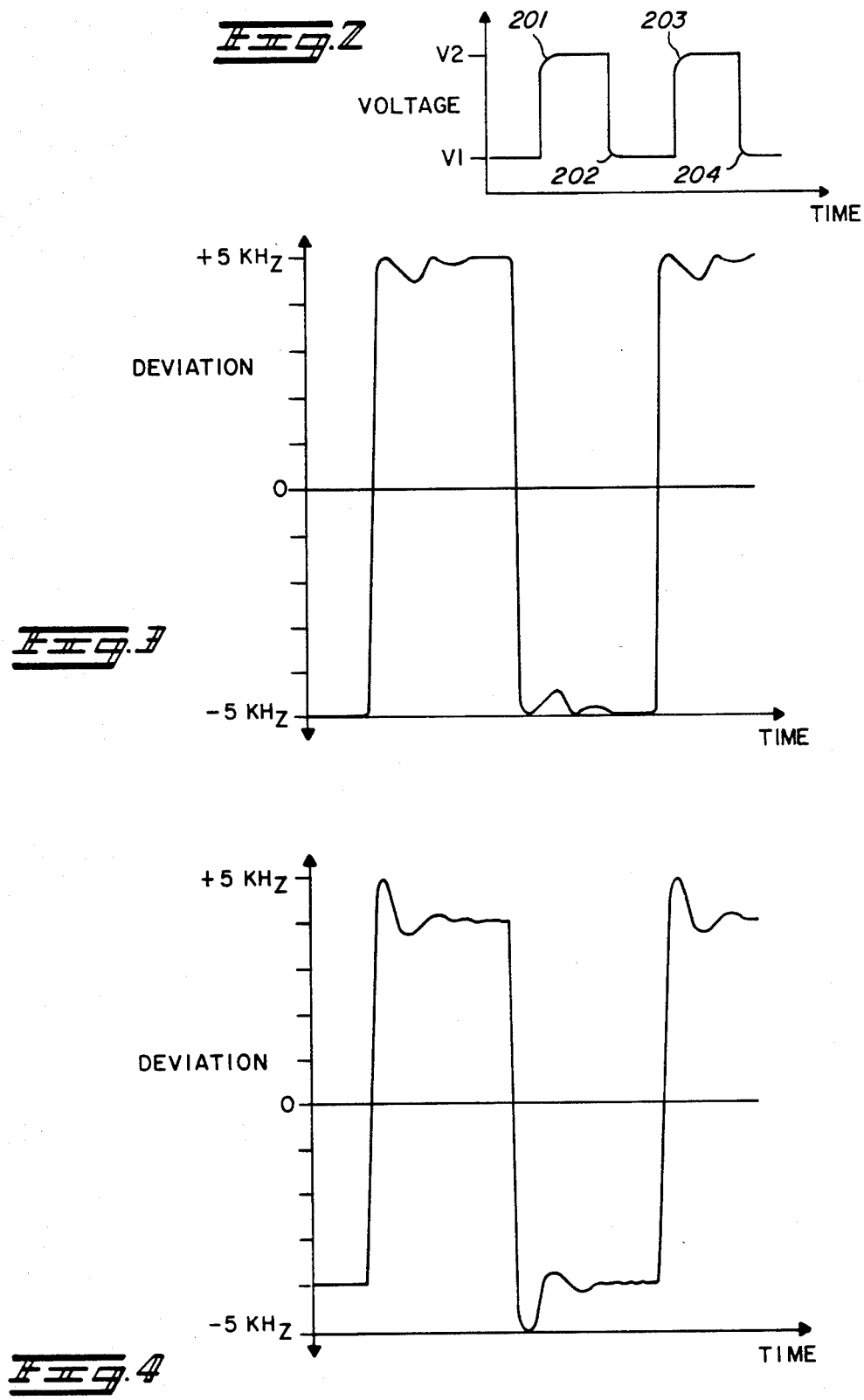

RADIO TRANSMITTER MODULATION CONTROL CIRCUITRY

This is a continuation of U.S. patent application Ser. No. 06/473,523 filed Mar. 10, 1983 and now abandoned, which in turn is a continuation of U.S. patent application Ser. No. 267,096 filed May 26, 1981 and now abandoned.

BACKGROUND OF THE INVENTION

The present invention relates generally to radio frequency (RF) signal transmitters, and more particularly to circuitry for controlling the modulation of such RF signal transmitters.

In both frequency and amplitude modulated RF signal transmitters, it is necessary to limit the degree of modulation of the transmitter due to Federal Communications Commission (FCC) requirements. Furthermore, overmodulating of the transmitter may also result in modulating signal distortion and interference with other radio communications. Conventional circuitry for limiting transmitter modulation have typically utilized back-to-back rectifiers or diodes, as shown in U.S. Pat. Nos. 2,025,595, and 2,491,590, and have also utilized limiting circuitry such as that described in U.S. Pat. Nos. 3,320,536, 3,626,331, 3,986,049 and 4,038,603, for preventing the modulating signals from exceeding a predetermined maximum peak-to-peak voltage swing. However, these circuits are non-linear in nature transforming the modulating signals into square waves. The harmonic signal content of the square waves causes the transmitted signal to have a wider than normal bandwidth. In order to keep the bandwidth of the transmitted signal within preselected limits, a so-called splatter filter is typically introduced between the modulation control circuitry and the transmitter. A splatter filter sharply attentuates signals having frequencies above 3000 Hz. However, since such splatter filters do not adequately attenuate all of the harmonic signals in the square waves, the modulating signals must be further attenuated in amplitude before application to the modulator so that the FCC modulation limit of the transmitted signal is not exceeded. Furthermore, reducing the modulating signal amplitude degrades audio signal quality since the signal-to-noise ratio is decreased.

SUMMARY OF THE INVENTION

Accordingly, it is an object of the present invention to provide improved transmitter modulation control circuitry that maximizes the signal-to-noise ratio of the transmitted signal.

It is another object of the present invention to provide improved transmitter modulation control circuitry that alters the phase of high frequency harmonic signals produced by amplitude limiting of the modulating signals.

It is yet another object of the present invention to provide improved amplifying circuitry that has a flat frequency response when linearly operated and alters the phase and amplitude of high frequency harmonic signals when driven into amplitude limiting.

Briefly described, an embodiment of the transmitter modulation control circuitry of the present invention includes an improved audio signal amplifier comprised of an operational amplifier having an input resistor coupled to the audio signals from a microphone, a filter coupled to the output of the operational amplifier and a feedback resistor coupled between the filter and the input resistor. When driven into amplitude limiting, the phase and amplitude of harmonic signals from the operational amplifier are altered by the filter. When operated linearly, the audio signal amplifier has a flat frequency response, the filter having no effect since it is in the feedback loop. The output signal from the audio signal amplifier may be coupled to a splatter filter and thereafter to a modulator for modulating a radio signal transmitter. Once the modulation limit of the transmitted signal has been selected, the amplitude of the output signal from the splatter filter can be adjusted so that the modulation limit is not exceeded when the audio signal amplifier is driven into amplitude limiting. By utilizing the improved audio signal amplifier of the present invention, the average power of the modulating signal can be greatly increased over that achievable by the prior art, resulting in a significant improvment in signal-to-noise ratio.

BRIEF DESCRIPTION OF THE DRAWINGS

FIG. 1 is a block diagram of transmitter modulation control circuitry embodying the present invention.

FIG. 2 is a typical waveform illustrating the signal generated by audio amplifier 120 in FIG. 1 when audio amplifier is driven into amplitude limiting.

FIG. 3 is a typical waveform illustrating the signal generated by splatter filter 130 in FIG. 1 in response to the audio amplifier signal illustrated in FIG. 2.

FIG. 4 is a typical waveform illustrating the signal generated by splatter filter 130 in FIG. 1 in response to a square wave.

DESCRIPTION OF THE PREFERRED EMBODIMENT

In FIG. 1, there is illustrated a radio 100 embodying the transmitter modulation control circuitry of the present invention. The transmitter modulation control circuitry includes microphone 110, audio amplifier 120, splatter filter 130, modulator 150, oscillator and transmitter 180 and antenna 190. Microphone 110, splatter filter 130, modulator 150 and oscillator and transmitter 180 are conventional circuit elements found in frequency modulated (FM) radios, such as, for example, the FM radio described in Motorola Instruction Manual 68P81043E45, entitled "SYNTOR Two-Way FM Radio", published by Motorola Service Publications, 1301 East Algonquin Road, Schaumburg, Ill., 1980. Conventional frequency modulation techniques are described in detail in "Information Transmission, Modulation, and Noise", by Mischa Schwartz, published by McGraw-Hill Book Co., Inc., 1959, at pages 111–141.

Audio signals from microphone 110 are coupled to audio amplifier 120 which provides a preselected amount of gain to the audio signals. Audio amplifier 120 has a flat frequency response over the audio signal frequency range, typically 300 Hz to 3000 Hz for radio communications. The amplified audio signals from audio amplifier 120 are coupled to splatter filter 130 which attenuates high frequency signals. Splatter filter 130 is typically a low pass filter that sharply attenuates signals having a frequency greater than 3000 Hz. High frequency signals must be attenuated by the splatter filter 130 since such high frequency signals would otherwise cause the transmitted signal to exceed bandwidth limits set by the Federal Communications Commission (FCC).

The audio signals from splatter filter 130 are coupled to potentiometer 140 and thereafter to modulator 150. Potentiometer 140 is included for adjusting the modulation of the transmitted signal. In order to set the modulation of the transmitted signal to the FCC modulation limit, a 1,000 Hz signal is typically introduced into audio amplifier 120 at a sufficient amplitude to drive audio amplifier 120 into amplitude limiting, as illustrated by the waveform in FIG. 2. While audio amplifier 120 is being driven into amplitude limiting, potentiometer 140 is adjusted so that peaks of the transmitted signal do not exceed the FCC modulation limit. For example, the FM radio described in aforementioned Motorola manual no. 68P81043E45 has a 5000 Hz modulation limit, commonly referred to as the maximum allowable transmitter deviation.

In the preferred embodiment of the present invention, audio amplifier 120 includes a conventional operational amplifier 160 and a phase-lag filter 170 coupled between the operational amplifier output and feedback resistor 161. Audio signals from microphone 110 are coupled to operational amplifier 160 by way of capacitor 168 and input resistor 162. The voltage gain provided by operational amplifier 160 is determined approximately by the ratio of the feedback resistor 161 to the input resistor 162. Operational amplifier 160 is biased at one-half of the +V supply voltage by resistor divider 163 and 165. If both positive and negative supply voltages are available, resistors 163 and 165 and capacitor 164 are not needed since the plus input of operational amplifier 160 and resistor 167 may be connected directly to signal ground. The biasing voltage from resistors 163 and 165 is filtered by capacitor 164 and also applied to output resistor 166 via resistor 167. Output resistor 166 and resistor 167 comprise a voltage divider which reduces the maximum peak-to-peak output signal from audio amplifier 120 to an acceptable level for splatter filter 130. The electrical characterisitics of amplifying circuits using operational amplifiers are generally described in "Analog Computer Techniques", by Clarence L. Johnson, published by McGraw-Hill Book Company, Inc., 1963.

According to an important feature of the present invention, phase-lag filter 170 consisting of resistors 171 and 173 and capacitor 172, is introduced inside the feedback loop of operational amplifier 160. The phase-lag filter 170 has no effect on the amplifier output signal until the operational amplifier 160 is driven into amplitude limiting. Thus, when operational amplifier 160 is not being driven into amplitude limiting, the effects of phase-lag filter 170 are eliminated since phase-lag filter 170 is included in the feedback loop with resistor 161. When driven into amplitude limiting, the clipped amplifier output signal is no longer affected by the feedback loop and instead is affected by the phase-lag filter 170. The phase-lag filter 170 alters both the amplitude and phase of the harmonic signals so that the rising and falling edges 201–204 of the clipped amplifier output signal are rounded off, as illustrated by the waveform in FIG. 2. As illustrated in FIG. 3, the output signal of splatter filter 130 does not overshoot its peak-to-peak voltage in response to the waveform illustrated in FIG. 2, whereas, as illustrated in FIG. 4, the output signal of splatter filter 130 overshoots its peak-to-peak voltage in response to a square wave. Potentiometer 140 must be adjusted to take into account the overshoot of the splatter filter output signal in FIG. 4, introducing more attenuation than required for the splatter filter output signal in FIG. 3. Since the splatter filter output signal in FIG. 3 does not overshoot, the average modulating signal power is increased over that obtainable by prior art modulating circuitry. Based on empirical measurements, transmitter modulation control circuitry embodying the present invention results in a 2.1 dB improvement or a 64% increase in average modulating signal power when utilized in an FM radio having a maximum deviation of 5,000 Hz.

The particular values of the components 171, 172 and 173 in phase-lag filter 170 will depend on the electrical characteristics of the splatter filter 130 actually utilized. For an FM radio having a +V voltage supply of 13.6 volts, approximate component values for the circuit elements of audio amplifier 120 are shown in Table I hereinbelow. An audio amplifier mechanized with these components has a small signal gain of approximately twelve.

TABLE I

| | |
|---|---|
| Operational Amplifer 160 | MC3403 |
| Resistor 161 | 720,000 ohms |
| Resistor 162 | 62,000 ohms |
| Resistor 163 | 10,000 ohms |
| Capacitor 164 | 10 microFarads |
| Resistor 165 | 10,000 ohms |
| Resistor 166 | 470,000 ohms |
| Resistor 167 | 470,000 ohms |
| Resistor 171 | 27,000 ohms |
| Capacitor 172 | 1,800 PicoFarads |
| Resistor 173 | 62,000 ohms |

In summary, an improved radio transmitter modulation control circuitry has been described that significantly increases the average power of the transmitter modulating signal. The inventive transmitter modulation control circuitry can be utilized in both amplitude and frequency modulated radios for enhancing the audio signal performance thereof. Since the signal-to-noise radio of the modulating signal is increased by utilizing the present invention, the intelligibility of radio communications is greatly improved.

I claim:

1. Circuitry for controlling modulation of a radio frequency signal transmitter by audio signals from a signal source, comprising:
    (a) audio signal amplifying means comprising:
        (i) input impedance means having first and second terminals, the first terminal of the input impedance means being coupled to the audio signals from the signal source;
        (ii) feedback impedance means having first and second terminals, the second terminal of the feedback impedance means being coupled to the second terminal of the input impedance means;
        (iii) means, having input and output terminals, for amplifying a signal at its input terminal to provide an amplified signal at its output terminal, the input terminal of the amplifying means being coupled to the second terminals of the input impedance means and feedback impedance means; and
        (iv) first means, having input and output terminals, for filtering a signal at its input terminal to provide a filtered signal at its output terminal, the input terminal of the first filtering means being coupled to the output terminal of the amplifying means and the output terminal of the first filtering means coupled to the first terminal of the feedback impedance means;

(b) second means, having input and output terminals, for filtering signals at its input terminal to provide filtered signals at its output terminal, the input terminal of the second filtering means being coupled to the output terminal of the first filtering means and the first terminal of the feedback impedance means, the second filtering means attenuating signals from the first filtering means having frequencies above a predetermined frequency;

(c) means for transmitting a radio frequency signal having a predetermined frequency; and (d) means, having an input terminal coupled to the output terminal of the second filtering means and an output terminal coupled to the transmitting means, for modulating the radio frequency signal transmitted by the transmitting means with the signals from the second filtering means.

2. The modulation control circuitry according to claim 1, further including means, having an input terminal coupled to the output terminal of the second filtering means and an output terminal coupled to the modulating means, for attenuating the filtered signals from the second filtering means.

3. The modulation control circuitry according to claim 2, wherein the amplifying means comprises an operational amplifier.

4. The modulation control circuitry according to claim 1 or 3, wherein the first filtering means includes means for phase shifting the signals from the amplifying means and means for attenuating the signals from the amplifying means.

5. The modulation control circuitry according to claim 4, wherein the phase shifting means includes capacitive impedance means and the attenuating means includes resistive impedance means.

6. The modulation control circuitry according to claim 1, wherein the first filtering means includes means for phase shifting the signals from the amplifying means and means for attenuating the signals from the amplifying means.

7. The modulation control circuitry according to claim 6, wherein the phase shifting means includes capacitive impedance means and the attenuating means includes resistive impedance means.

8. Circuitry for controlling modulation of a radio frequency signal transmitter by audio signals from a signal source, said modulation control circuitry including audio signal amplifying means coupled to the signal source and modulating means coupled between the audio signal amplifying means and the transmitter, said audio signal amplifying means further comprising:

input impedance means having first and second terminals, the first terminal of the input impedance means being coupled to the audio signal from the signal source;

feedback impedance means having first and second terminals, the first terminal of the feedback impedance means coupled to the modulating means, and the second terminal of the feedback impedance means being coupled to the second terminal of the input impedance means;

means, having input and output terminals, for amplifying a signal at its input terminal to provide an amplified signal at its output terminal, the input terminal of the amplifying means being coupled to the second terminals of the input impedance means and feedback impedance means; and filtering means, including capactive impedance means, first resistive impedance means and second resistive impedance means each having first and second terminals, for phase shifting and attenuating signals from the amplifying means, the first terminal of the first resistive impedance means being coupled to the output terminal of the amplifying means, and the second terminal of the first resistive impedance means being coupled to the modulating means, to the first terminal of the feedback impedance means and to the first terminal of the capacitive impedance means, the second terminal of the capacitive impedance means being coupled to the first terminal of the second resistive impedance means, and the second terminal of said second resistive impedance means being coupled to signal ground.

9. The modulation control circuitry according to claim 8, further including attenuating means interposed between the filtering means and the modulating means, said attenuating means having an input terminal coupled to the second terminal of the first resistive means and an output terminal coupled to the modulating means for attenuating the filtered signal from the filtering means.

10. The modulation control circuitry according to claim 9, wherein the amplifying means comprises an operational amplifier.

11. Circuitry for amplifying an audio signal generated by a signal source to provide an output signal, comprising:

input impedance means having first and second terminals, the first terminal of the input impedance means being coupled to the audio signal from the signal source;

feedback impedance means having first and second terminals, the second terminal of the feedback impedance means being coupled to the second terminal of the input impedance means;

amplifying means, having input and output terminals, for amplifying a signal at its input terminal to provide an amplified signal at its output terminal, the input terminal of the amplifying means being coupled to the second terminals of the input impedance means and feedback impedance means;

phase shifting means, including capacitive impedance means having first and second terminals, for phase shifting the signals from the amplifying means; and attenuating means, including first and second resistive impedance means each having first and second terminals, for attenuating signals from the amplifying means, the first terminal of the first resistive impedance means being coupled to the output terminal of the amplifying means, and the second terminal of the first resistive impedance means providing the output signal of the amplifying circuitry and being coupled to the first terminal of the feedback impedance means and to the first terminal of the capacitive impedance means, the second terminal of the capacitive impedance means being coupled to the first terminal of the second resistive impedance means, the second terminal of said second resistive impedance means being coupled to signal ground.

12. Circuitry for amplifying an audio signal generated by a signal source to provide an output signal, comprising:

input impedance means having first and second terminals, the first terminal of the input impedance means being coupled to the audio signal from the signal source;

feedback impedance means having first and second terminals, the second terminal of the feedback impedance means being coupled to the second terminal of the input impedance means;

amplifying means, having input and output terminals, for amplifying a signal at its input terminal to provide an amplified signal at its output terminal, the input terminal of the amplifying means being coupled to the second terminals of the input impedance means and feedback impedance means;

phase shifting means, including capacitive impedance means for phase shifting the signals from the amplifying means; and attenuating means, including first and second resistive impedance means for attenuating signals from the amplifying means, the first resistive impedance means having a first terminal that is coupled to the output terminal of the amplifying means, and having a second terminal that provides the output signal of the amplifying circuitry and that is coupled to the first terminal of the feedback impedance means, and the capacitive impedance means and the second resistive impedance means being series coupled between the second terminal of the first resistive impedance means and signal ground.

13. Circuitry for controlling modulation of a radio frequency signal transmitter by audio signals from a signal source, comprising:

(a) audio signal amplifying means comprising:
   (i) input impedance means having first and second terminals, the first terminal of the input impedance means being coupled to the audio signals from the signal source
   (ii) feedback impedance means having first and second terminals, the second terminal of the feedback impedance means being coupled to the second terminal of the input impedance means;
   (iii) means, having input and output terminals, for amplifying a signal at its input terminal to provide an amplified signal at its output terminal, the input terminal of the amplifying means being coupled to the second terminals of the input impedance means and feedback impedance means; and
   (iv) means, having input and output terminals, for filtering a signal at its input terminal to provide a filtered signal at its output terminal, the input terminal of the filtering means being coupled to the output terminal of the amplifying means and the output terminal of the filtering means coupled to the first terminal of the feedback impedance means;

(b) means for transmitting a radio frequency signal having a predetermined frequency; and (c) means, having an input terminal coupled to the output terminal of the filtering means and an output terminal coupled to the transmitting means, for modulating the radio frequency signal transmitted by the transmitting means with the signals from the filtering means.

14. Circuitry for controlling modulation of a radio frequency signal transmitter by audio signals from a signal source, said modulation control circuitry including audio signal amplifying means coupled to the signal source and modulating means coupled between the audio signal amplifying means and the transmitter, said audio signal amplifying means further comprising:

input impedance means having first and second terminals, the first terminal of the input impedance means being coupled to the audio signals from the signal source;

feedback impedance means having first and second terminals, the first terminal of the feedback impedance means coupled to the modulating means, and the second terminal of the feedback impedance means being coupled to the second terminal of the input impedance means;

means, having input and output terminals, for amplifying a signal at its input terminal to provide an amplified signal at its output terminal, the input terminal of the amplifying means being coupled to the second terminals of the input impedance means and feedback impedance means; and filtering means, including first resistive impedance means having first and second terminals and series-coupled capacitive impedance means and second resistive impedance means, for phase shifting and attenuating signals from the amplifying means, the first terminal of the first resistive impedance means being coupled to the output terminal of the amplifying means, and the second terminal of the first resistive impedance means being coupled to the modulating means, to the first terminal of the feedback impedance means and to signal ground by the series-coupled capacitive impedance means and second resistive impedance means.

15. Circuitry for amplifying an audio signal generated by a signal source to provide an output signal, comprising:

input impedance means having first and second terminals, the first terminal of the input impedance means being coupled to the audio signal from the signal source;

amplifying means, having an output terminal and at least two input terminals, for amplifying a signal at its input terminals to provide an amplified signal at its output terminal, one of the input terminals of the amplifying means being coupled to the second terminal of the input impedance means;

feedback impedance means having first and second terminals, the second terminal of the feedback impedance means being coupled to the other one of the input terminals of the amplifying means;

phase shifting means, including capacitive impedance means for phase shifting the signals from the amplifying means; and attenuating means, including first and second resistive impedance means for attenuating signals from the amplifying means, the first resistive impedance means having a first terminal that is coupled to the output terminal of the amplifying means, and having a second terminal that provides the output signal of the amplifying circuitry and that is coupled to the first terminal of the feedback impedance means, and the capacitive impedance means and the second resistive impedance means being series coupled between the second terminal of the first resistive impedance means and signal ground.

16. Circuitry for controlling modulation of a radio frequency signal transmitter by audio signals from a signal source, said modulation control circuitry including audio signal amplifying means coupled to the signal source and modulating means coupled between the audio signal amplifying means and the transmitter, said audio signal amplifying means further comprising:

input impedance means having first and second terminals, the first terminal of the input impedance means being coupled to the audio signals from the signal source;

means, having an output terminal and at least two input terminals, for amplifying a signal at its input terminals to provide an amplified signal at its output terminal, one of the input terminals of the amplifying means being coupled to the second terminal of the input impedance means;

feedback impedance means having first and second terminals, the first terminal of the feedback impedance means coupled to the modulating means, and the second terminal of the feedback impedance means being coupled to the other one of the input terminals of the amplifying means; and filtering means, including first resistive impedance means having first and second terminals and series-coupled capacitive impedance means and second resistive impedance means, for phase shifting and attenuating signals from the amplifying means, the first terminal of the first resistive impedance means being coupled to the output terminal of the amplifying means, and the second terminal of the first resistive impedance means being coupled to the modulating means, to the first terminal of the feedback impedance means and to signal ground by the series-coupled capacitive impedance means and second resistive impedance means.

17. Circuitry for controlling modulation of a radio frequency signal transmitter by audio signals from a signal source, comprising:

(a) audio signal amplifying means comprising:

(i) input impedance means having first and second terminals, the first terminal of the input impedance means being coupled to the audio signals from the signal source, (ii) means, having an output terminal and at least two input terminals, for amplifying a signal at its input terminals to provide an amplified signal at its output terminal, one of the input terminals of the amplifying means being coupled to the second terminal of the input impedance means;

(iii) feedback impedance means having first and second terminals, the second terminal of the feedback impedance means being coupled to the other one of the input terminals of the amplifying means; and (iv) means, having input and output terminals, for filtering a signal at its input terminal to provide a filtered signal at its output terminal, the input terminal of the filtering means being coupled to the output terminal of the amplifying means and the output terminal of the filtering means coupled to the first terminal of the feedback impedance means;

(b) means for transmitting a radio frequency signal having a predetermined frequency; and (c) means, having an input terminal coupled to the output terminal of the filtering means and an output terminal coupled to the transmitting means, for modulating the radio frequency signal transmitted by the transmitting means with the signals from the filtering means.

* * * * *